(12) United States Patent
Riccobene et al.

(10) Patent No.: US 6,274,501 B1
(45) Date of Patent: Aug. 14, 2001

(54) FORMATION OF STRUCTURE TO ACCURATELY MEASURE SOURCE/DRAIN RESISTANCE

(75) Inventors: Concetta Riccobene, Mountain View; Ognjen Milic-Strkalj, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/496,611

(22) Filed: Feb. 2, 2000

(51) Int. Cl.[7] .................................................. H01L 21/302
(52) U.S. Cl. .......................... 438/710; 438/719; 438/723; 438/733; 438/743; 438/745
(58) Field of Search ....................................... 438/706, 710, 438/719, 723, 733, 743, 745, 756, 618

(56) References Cited

U.S. PATENT DOCUMENTS

| | | |
|---|---|---|
| 5,869,879 * | 2/1999 | Fulford, Jr. et al. ................... 257/510 |
| 6,005,272 * | 12/1999 | Gardner et al. ....................... 257/344 |
| 6,110,790 * | 8/2000 | Chen .................................... 438/305 |
| 6,127,232 * | 10/2000 | Chatterjee ............................ 438/291 |
| 6,140,219 * | 10/2000 | Dennison ............................. 438/618 |

* cited by examiner

Primary Examiner—Benjamin L. Utech
Assistant Examiner—Binh X. Tran

(57) ABSTRACT

A method is provided for directly measuring the source/drain resistance of a metal oxide semiconductor (MOS) device. Embodiments include partially deconstructing a typical MOS device by removing its gate and gate oxide from the substrate, as by etching, while preserving its gate sidewall spacer (typically silicon nitride). A sacrificial oxide spacer is formed on the nitride spacer, as by anisotropically etching a deposited oxide layer, and the area surrounding the sacrificial oxide spacer is filled with a layer of nitride. The sacrificial oxide spacer is then selectively etched to expose a portion of the main surface of the substrate and leave the nitride spacer and layer, thus creating a location near the edge of a source/drain region for a metal contact to be formed, as by chemical vapor deposition (CVD). The source/drain resistance of the device can then be directly and accurately measured by making electrical contact to the newly formed contact and a pre-existing source/drain contact on the same active area.

10 Claims, 4 Drawing Sheets

FORMATION OF STRUCTURE TO ACCURATELY MEASURE SOURCE/DRAIN RESISTANCE

FIELD OF THE INVENTION

The present invention relates to a method of forming an electrical contact on a semiconductor substrate. The invention has particular applicability in testing electrical characteristics of active regions of semiconductor devices.

BACKGROUND ART

Current demands for high density and performance associated with ultra large scale integration require submicron features of about 0.18 microns and under, increased transistor and circuit speeds and improved reliability. Such demands for increased density, performance and reliability require formation of device features with high precision and uniformity. Consequently, the need for device optimization, including accurate measuring of device electrical characteristics, has become increasingly critical.

Metal oxide semiconductor (MOS) devices, as depicted in FIG. 1, are the building blocks of today's circuits, and typically comprise a pair of active regions 110 (also called source/drain regions) formed, as by ion implantation, in a silicon substrate 100, and separated by an ion-implanted channel region 120. A gate oxide layer 130 is formed above channel region 120, and a conductive gate 140, such as a polysilicon gate, is formed on gate oxide layer 130.

To predict device performance, circuit designers typically employ "compact models" in the form of software, which characterize transistors, such as MOS devices, using a limited number of measured device electrical characteristics. The results of compact modeling are then used in circuit simulation to optimize the circuit. An important input for compact modeling is source/drain resistance; that is, the resistance carriers meet when they move from a source/drain region 110 to channel region 120. It is highly desirable to obtain an accurate measurement of source/drain resistance (Rds). However, Rds of an actual device cannot be measured directly using conventional techniques. Rather, the prior art typically derives Rds after measuring other electrical characteristics; e.g., the drain current of devices at different gate voltages.

One such prior art technique is illustrated in FIG. 2, wherein Rds is derived by comparing voltage and current measurements of a "nominal" device to those of a long channel device. As shown in FIG. 2, which graphs gate length along the x-axis and Rds along the y-axis, a particular gate voltage Vg' is selected, and the corresponding drain current IVg' is measured for different gate lengths, enabling calculation of Rds at each gate length to produce a line, as shown. Then, a different gate voltage Vg" is selected and the procedure repeated. In theory, the y-coordinate of the point where the lines associated with Ivg' and Ivg" cross is the desired value of RDS of a nominal device.

This technique produces an acceptably accurate value of Rds when the channel region of the device is uniformly doped. Disadvantageously, as device structures become more complex and channel regions are non-uniformly doped to optimize device performance (e.g., using retrograded doping profiles, pocket implants, HALO implants, etc.), the validity of such conventional techniques for deriving Rds no longer holds, and it becomes much more difficult to derive accurate Rds values.

There exists a need for a methodology for accurately measuring Rds of MOS devices directly, thereby enabling more accurate compact modeling of such devices and, consequently, facilitating device optimization.

SUMMARY OF THE INVENTION

An advantage of the present invention is a method of directly and accurately measuring source/drain resistance of a MOS device.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method for forming an electrical contact on a main surface of a semiconductor substrate to an active region in the substrate, wherein a gate oxide layer is disposed on a portion of the active region and extends over an edge of the active region, a gate is disposed on the gate oxide layer, and a sidewall spacer of a dielectric material is disposed on a sidewall of the gate and extends onto the active region. The method comprises etching to remove the gate and the gate oxide layer; forming a sacrificial oxide layer on the sidewall spacer and the main surface; anisotropically etching the sacrificial oxide layer to form a sacrificial oxide spacer on the sidewall spacer and extending onto the main surface; forming a layer of the dielectric material on the sacrificial oxide spacer and extending onto the main surface; selectively etching to remove the sacrificial oxide spacer and expose a portion of the main surface while preserving the sidewall spacer and dielectric material layer; and forming a metal layer on the exposed portion of the main surface between the sidewall spacer and the dielectric material layer to form the electrical contact.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for determining the source/drain resistance of MOS devices rely on derivation of Rds based on measurements of other electrical characteristics of the device, which derivation techniques do not produce accurate results for complex device structures. The present invention addresses and solves these problems stemming from conventional derivation techniques by enabling the direct measurement of Rds by forming an electrical contact to the source/drain region whose resistance is to be measured.

According to the methodology of the present invention, a typical MOS device whose Rds is to be measured is partially "deconstructed" by removing its gate and gate oxide from the substrate, as by etching, while preserving its gate sidewall spacer (typically formed of a dielectric material such as silicon nitride). As used throughout the present disclosure and claims, the term "substrate" denotes a semiconductor substrate or an epitaxial layer formed on the semiconductor substrate. A sacrificial oxide spacer is formed on the sidewall spacer, as by anisotropically etching a deposited oxide layer, and the area surrounding the sacrificial oxide spacer is filled with a layer of the dielectric material, such as nitride. The sacrificial oxide spacer is then selectively etched to expose a portion of the main surface of the substrate and leave the dielectric layer and dielectric spacer, thus creating a location near the edge of a source/drain region for a metal contact to be formed, as by chemical vapor deposition (CVD). The source/drain resistance of the device can then be directly and accurately measured by making electrical contact to the newly formed contact and a pre-existing source/drain contact on the same active area.

Figure 1:
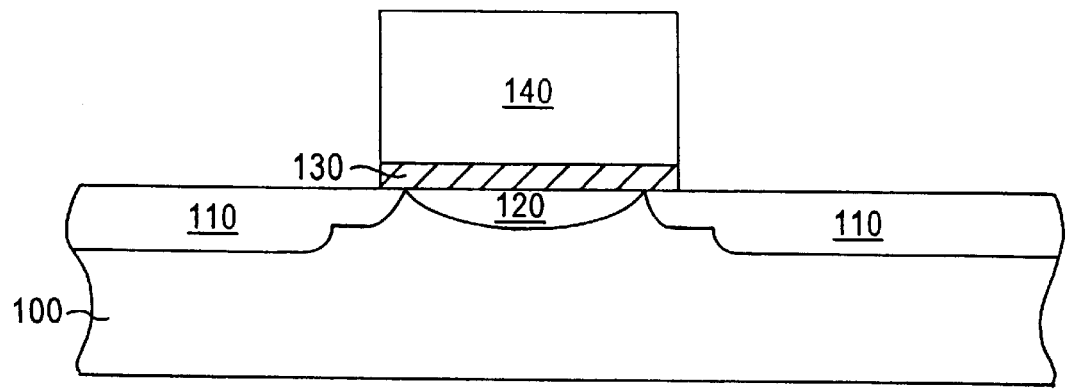
FIG. 1 depicts a typical metal oxide semiconductor device.
Figure 2:
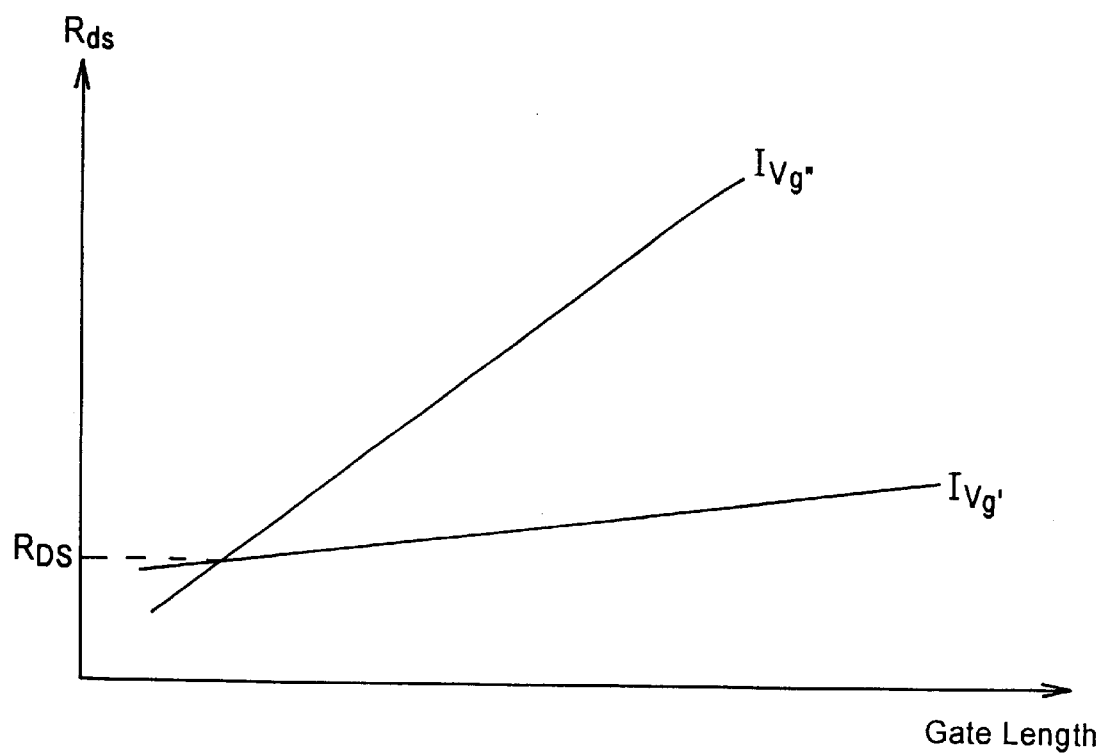
FIG. 2 graphically illustrates a conventional method for deriving source/drain resistance.
Figure 3A:
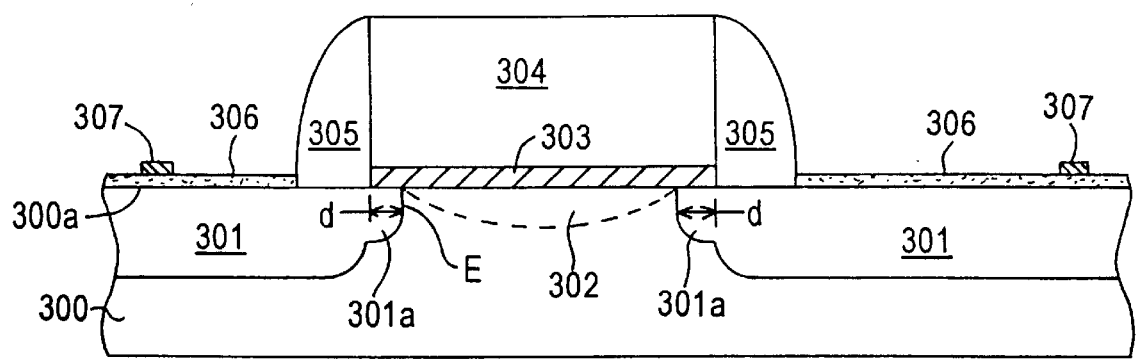
FIGS. 3A–3H schematically illustrate sequential phases of a method in accordance with an embodiment of the present invention.

One embodiment of the present invention will now be described with reference to FIGS. 3A–3H. FIG. 3A is a partial cross-sectional view of a typical MOS device whose source/drain resistance Rds is to be measured using the inventive methodology. A pair of source/drain regions or "active regions" 301 are formed in substrate 300, as by a plurality of ion implantation steps, such as a lightly-to-moderately doped implant and a heavier and/or higher-energy implant, thereby forming a stepped shape featuring a so-called "source/drain extension" 301 a. An ion-implanted channel region 302 is also formed in substrate 300 between source/drain regions 301.

A thermally formed gate oxide layer 303 is disposed on a main surface 300a of substrate 300 above channel region 303 and extending over an edge E of source/drain region 301, and a conductive gate 304, such as polysilicon, is disposed on gate oxide layer 303. Dielectric spacers 305, such as nitride spacers, are disposed on sidewalls of gate 304 and extend onto source/drain regions 301. A refractory metal silicide layer 306 is formed on source/drain regions 301, and metal contacts 307, such as aluminum or copper, are formed on silicide layer 306.

Figure 3B:
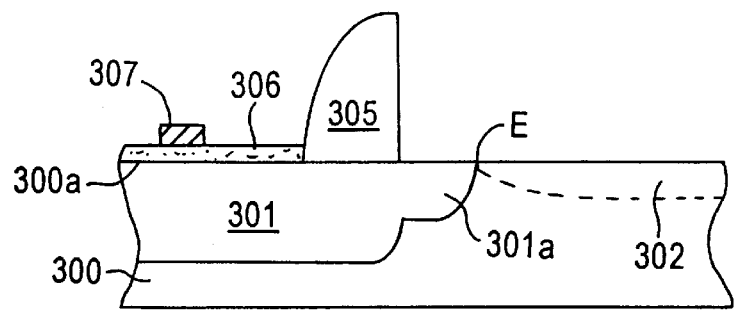

Referring to FIG. 3B, in this embodiment of the inventive methodology, gate 304 is etched away, as by wet etching, and gate oxide layer 303 is thereafter removed, as by dry etching. For convenience, only one source/drain region 301 is shown in FIGS. 3B et seq.; however, the present methodology can be simultaneously performed on both source/drain regions 301 if desired.

Figure 3C:
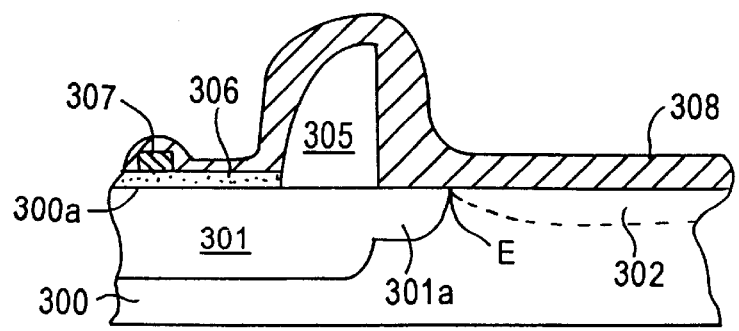
Figure 3D:
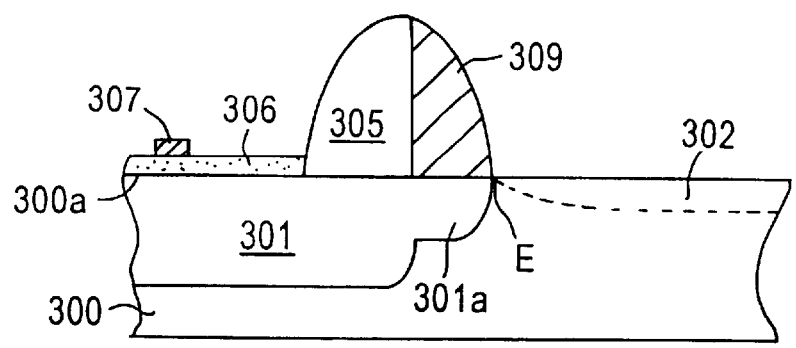

Next, a conformal sacrificial oxide layer 308 is deposited on sidewall spacers 305 and extending onto main surface 300a, such as a silicon dioxide layer derived from tetraethyl orthosilicate (TEOS) by low pressure chemical vapor deposition (LPCVD), silicon dioxide derived from silane by LPCVD, or a high density plasma oxide (see FIG. 3C). Sacrifical oxide layer 308 is then anisotropically etched to form sacrificial oxide spacer 309 on sidewall spacer 305 and extending onto main surface 300a (see FIG. 3D).

After anisotropic etching, sacrificial oxide spacer 309 preferably extends onto main surface 300a to the proximity of edge E of active region 301, thereby enabling the subsequently formed metal contact to be aligned with edge E. This alignment of the contact with edge E is important for ensuring an accurate resistance measurement of source/drain region 301, since source/drain extension 301a significantly affects the resistance of the entire region 301. Referring again to FIG. 3A, source/drain extension 301a typically extends under gate 304 a distance d of about 10–20 nanometers due to so-called "under diffusion" of implanted impurities during activation of the implants used to form source/drain regions 301. Therefore, referring again to FIG. 3D, sacrificial oxide layer 308 should be deposited to a thickness such that after etching, sacrificial oxide spacer 309 extends onto main surface 300a at least about 15 nanometers or to the proximity of edge E.

Figure 3E:
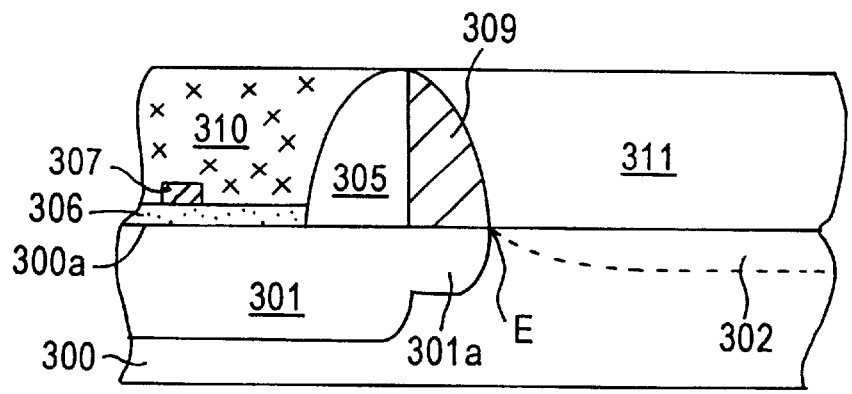

Referring now to FIG. 3E, a mask 310, such as a photoresist mask, is formed on sidewall spacer 305, silicide layer 306 and contact 307. A layer 311 of the dielectric material used to form sidewall spacer 305 is then deposited on the exposed sacrificial oxide spacer 309 and extending onto exposed main surface 300a, such as a silicon nitride layer by chemical vapor deposition (CVD). Mask 310 is thereafter removed. Mask 310 is complementary to the mask used to form gate 304. Thus, a special mask does not need to be produced for this step, since the pre-existing gate mask (or "poly mask") can be used again in a negative manner for this step, employing well-known photolithographic techniques.

Figure 3F:
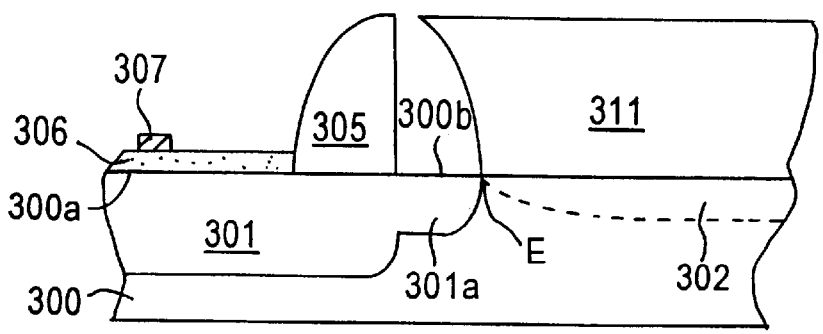
Figure 3G:
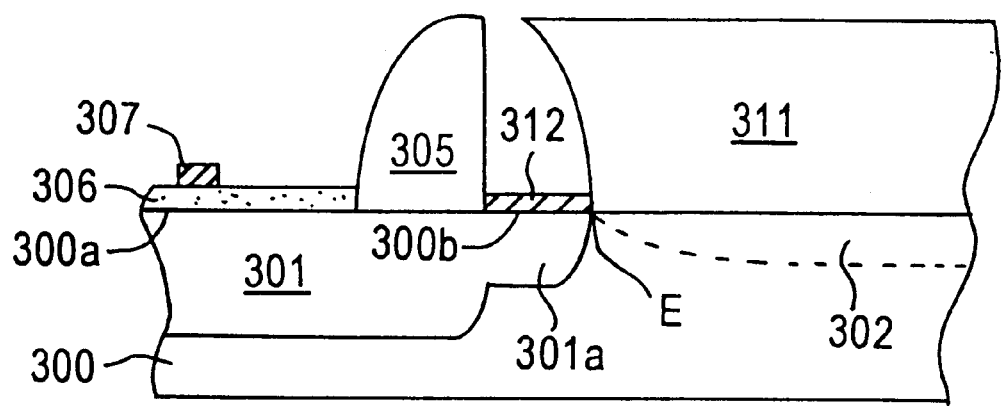

Sacrificial oxide spacer 309 is thereafter selectively etched using well-known etching techniques to expose a portion 300b of main surface 300a proximal to edge E, while preserving sidewall spacer 305 and dielectric material layer 311 (see FIG. 3F). Next, referring to FIG. 3G, a metal layer is deposited on portion 300b to form a second contact 312, preferably of the same metal used to form first contact 307, such as aluminum or copper by CVD or sputtering.

Figure 3H:
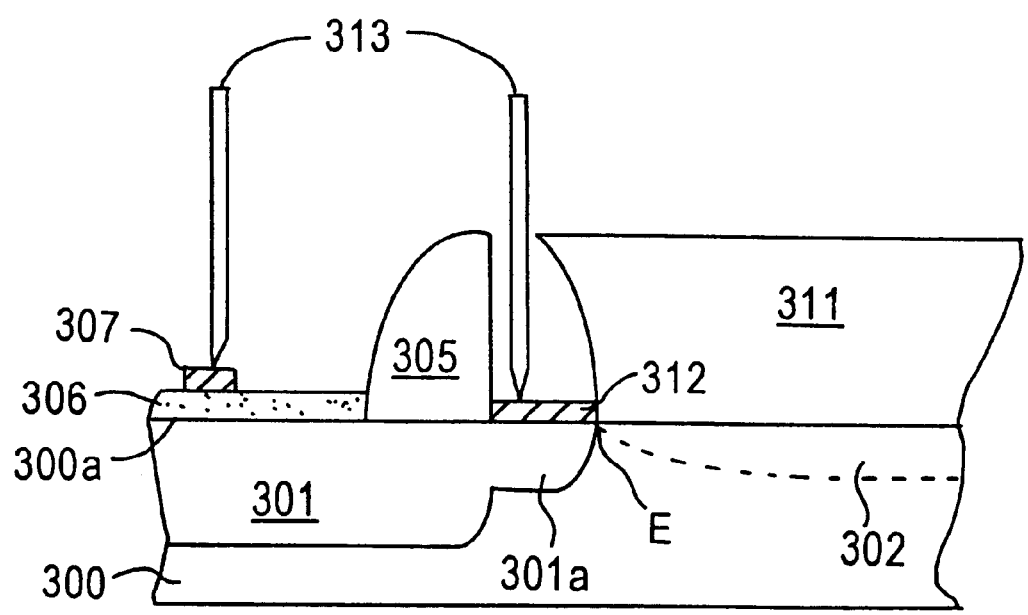

After contact 312 is formed, Rds of source/drain region 301 can be directly measured by conventional means, such as using contact probes 313, as shown in FIG. 3H, and applying current between contacts 307 and 312. Source/drain extension 301a, typically doped more lightly than the main portion of source/drain region 301, has a higher resistance than the main portion. Since contact 312 is located proximal to edge E, an accurate resistance measurement is possible, because source/drain extension 301a is between contacts 307 and 312.

By providing for the formation of contact 312 proximal to the edge of the source/drain extension 301a of source/drain region 301, the present invention enables a direct, accurate measurement of Rds of an active region of a semiconductor device, regardless of the doping profile and/or complexity of the source/drain and channel regions of the device. Thus, the present invention enables more precise modeling and simulation of semiconductor devices, thereby facilitating device optimization and reducing production costs.

The present invention is applicable to the manufacture of various types of semiconductor devices, particularly high density semiconductor devices having a design rule of about 0.18 and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method for forming an electrical contact on a main surface of a semiconductor substrate to an active region in the substrate, wherein a gate oxide layer is disposed on a portion of the active region and extends over an edge of the active region, a gate is disposed on the gate oxide layer, and a sidewall spacer of a dielectric material is disposed on a sidewall of the gate and extends onto the active region, the method comprising:

etching to remove the gate;

etching to remove the gate oxide layer;

forming a sacrificial oxide layer on the sidewall spacer and the main surface;

anisotropically etching the sacrificial oxide layer to form a sacrificial oxide spacer on the sidewall spacer and extending onto the main surface;

forming a layer of the dielectric material on the sacrificial oxide spacer and extending onto the main surface;

selectively etching to remove the sacrificial oxide spacer and expose a portion of the main surface while preserving the sidewall spacer and dielectric material layer; and forming a metal layer on the exposed portion of the main surface between the sidewall spacer and the dielectric material layer to form the electrical contact.

2. The method of claim 1, comprising forming the layer of dielectric material by depositing silicon nitride by chemical vapor deposition (CVD).

3. The method of claim 1, comprising forming the sacrificial oxide layer by depositing a conformal layer comprising silicon dioxide derived from tetraethyl orthosilicate (TEOS) by low pressure chemical vapor deposition (LPCVD), silicon dioxide derived from silane by LPCVD, or a high density plasma oxide.

4. The method of claim 1, comprising etching the sacrificial oxide layer such that it extends onto the main surface at least about 15 nanometers.

5. The method of claim 1, comprising wet etching to remove the gate.

6. The method of claim 1, comprising dry etching to remove the gate oxide layer.

7. The method of claim 1, comprising depositing a layer comprising aluminum or copper to form the electrical contact.

8. The method of claim 1, comprising:

anisotropically etching the sacrificial oxide layer such that it extends onto the main surface to the proximity of the edge of the active region; and selectively etching the sacrificial oxide spacer such that the exposed portion of the main surface includes a portion of the main surface proximal to the edge of the active region.

9. The method of claim 8, comprising measuring the electrical resistance of the active region between the electrical contact and a second electrical contact to the active region.

10. The method of claim 9, comprising applying current between the electrical contact and the second electrical contact.

* * * * *